United States Patent [19]

Prater

[11] Patent Number: 4,829,199
[45] Date of Patent: May 9, 1989

[54] DRIVER CIRCUIT PROVIDING LOAD AND TIME ADAPTIVE CURRENT

[75] Inventor: James S. Prater, Fort Collins, Colo.

[73] Assignee: NCR Corporation, Dayton, Ohio

[21] Appl. No.: 72,831

[22] Filed: Jul. 13, 1987

[51] Int. Cl.[4] .................... H03K 17/16; H03K 19/20; H03K 19/094

[52] U.S. Cl. .................................... 307/443; 307/445; 307/451; 307/454; 307/596

[58] Field of Search ............... 307/443, 445, 451, 454, 307/595–596

[56] References Cited

U.S. PATENT DOCUMENTS

| | | | |
|---|---|---|---|
| 3,879,619 | 4/1975 | Pleshko | 307/570 |
| 4,103,188 | 7/1978 | Morton | 307/446 |
| 4,408,135 | 10/1983 | Yuyama et al. | 307/451 |
| 4,437,024 | 3/1984 | Wacyk | 307/475 |
| 4,638,187 | 1/1987 | Boler et al. | 307/473 |
| 4,719,369 | 1/1988 | Asano et al. | 307/443 |
| 4,725,747 | 2/1988 | Stein et al. | 307/579 |
| 4,731,553 | 3/1988 | Van Lehn et al. | 307/443 |
| 4,779,013 | 10/1988 | Tanaka | 307/443 |
| 4,783,601 | 11/1988 | Hartgring et al. | 307/246 |
| 4,785,201 | 11/1988 | Martinez | 307/443 |

Primary Examiner—Stanley D. Miller
Assistant Examiner—M. R. Wambach
Attorney, Agent, or Firm—Wilbert Hawk, Jr.; Casimer K. Salys

[57] ABSTRACT

A CMOS inverter driver circuit for powering an integrated circuit output pad or the like, capable of adapting by feedback detection to varying capacitive load conditions, and providing incrementally delayed current increases to avoid power supply and ground path spikes. In one configuration, a CMOS inventer is connected to an output pad, which output pad is further common to one or more pairs of complementary supplemental driver transistor stages. The supplemental driver stages are enabled by OR and AND local blocks responsive to the combinations of the input signal level and the output pad signal level. The supplemental driver stages are thereby enabled only during transient periods, when the output pad signal level is capacitively loaded and thereby held to a previous input state. Successive logic/delay stages between supplemental driver stages smoothes the composite output current waveform.

5 Claims, 4 Drawing Sheets

DRIVER CIRCUIT PROVIDING LOAD AND TIME ADAPTIVE CURRENT

BRIEF SUMMARY

The present invention is directed to an electronic circuit, and more particularly to a driver circuit incorporating features which control the waveshape of the output current in adapting to load characteristics while minimizing transient extremes. The desirable attributes are particularly useful in the context of integrated circuit output pad driver applications, where the external load characteristics may vary significantly while internal power supply and ground path current peaks must be constrained.

According to the preferred practice of the invention, a primary CMOS inverter driver circuit configured from a series combination of p-channel and n-channel field effect transistors is supplemented by an additional pair of p-channel and n-channel transistors similarly configured between the power supply and ground potential. The transistor pairs share a common output node for the summing of current, the earlier noted output pad. Whereas the gate electrodes of the first specified primary inverter transistors are commonly connected as an input node, the supplemental p-channel and n-channel field effect transistor gate electrodes are individually driven by distinct logic circuits. The logic circuit inputs are individually connected to sense the voltages on the input node and the output node, to detect the logic states of those nodes and then generate respective control voltage signals suitable to drive the appropriate supplemental drive transistors. In the preferred embodiment, the supplemental p-channel field effect transistor is driven by a two input OR gate, while the supplemental n-channel transistor is driven by a two input AND gate. As so configured, the supplemental driver transistors are selectively enabled to supplement the load current conducted through the primary CMOS inverter driver. The supplemental action is time delayed by each interposed logic element. The instantaneous value of the output pad current is thereby reduced in magnitude and extended in time.

The logic stages used to enable the supplemental transistors also provide adaptability to load conditions, by ensuring that the supplemental stage, or stages, are operable only for those transient periods during which the current drive of the primary CMOS inverter is inadequate to supply the demanded and time prescribed load current. During static operation or transitions involving minimal load current variations, the supplemental driver transistor stages are effectively disabled. Thereby, the circuit of the present invention is also dynamically operative and self-adaptive as to load.

The beneficial features of the invention are particularly applicable to integrated circuit pad driver designs where widely varying loads must be driven with minimum spikes on the power supply or ground lines of the integrated circuit chip. Supplemental drivers of the form described can also be cascaded, to enable in linearly timed succession and in numerical proportion to the current demand of the load.

These and other beneficial aspects of the present invention will be more clearly understood upon considering the detailed embodiments which follow.

DETAILED DESCRIPTION OF THE EMBODIMENT

Output driver circuits, and particularly CMOS inverter driver configurations, are routinely used to buffer electrical signals on integrated circuits. In contemporary usage such circuits are frequently found as the output stage used to connect a signal from within an integrated circuit chip to the node of an output pad, which pad is itself electrically connected to a lead on the outside of the integrated circuit package by mechanical means. Consequently, the pad driver circuit interfaces with and must have the capability to drive the load connected to the lead of the integrated circuit package. As one would expect, the load to be driven by a pad is commonly determined by someone other than the designer of the integrated circuit itself.

Increasing the size of the output pad driver circuit transistors is not an effective solution to providing an acceptable output signal waveform in the face of diverse and often heavily capacitive loads on the pad. Significantly larger output pad driver transistors introduce operationally unacceptable current spike disturbances onto the power supply or ground lines of the chip. If these spikes are large enough, they can be misinterpreted as signals within the integrated circuit, and even at lesser levels contribute to the ground and power supply noise levels on the chip. Consequently, though large current drive capability is desired, the solution must be tempered with current waveshape controls operable over widely varying signal transient and load conditions.

Figure 1:
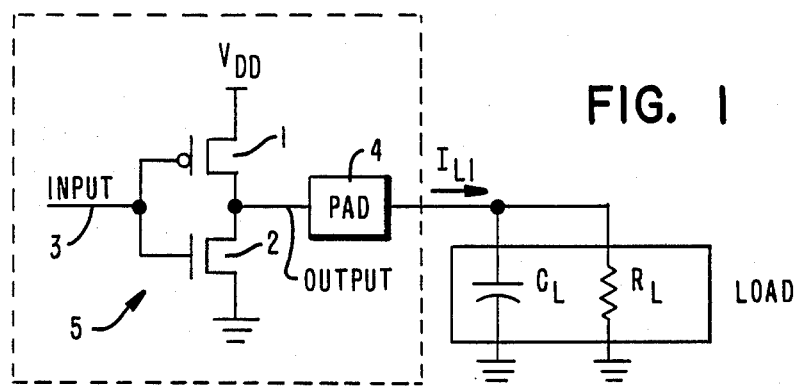
FIG. 1 is a schematic diagram of a classic CMOS inverter driver circuit used to power an output pad of an integrated circuit device.
Figure 2:
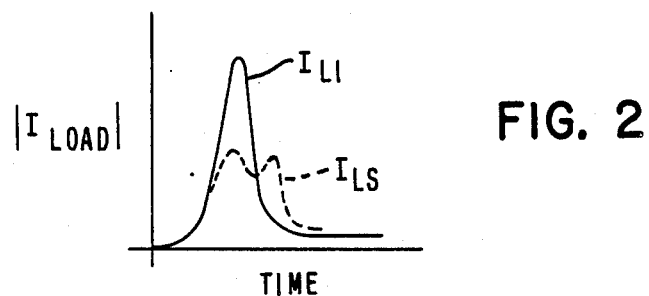
FIG. 2 schematically illustrates the load current waveforms for the circuits in FIGS. 1 and 3.

FIG. 1 illustrates a CMOS output pad driver circuit of conventional design, where the elements of the circuit, within the dashed block, are resident on a common integrated circuit chip. As shown, a p-channel transistor 1 is connected in series with an n-channel transistor 2, between power supply $V_{DD}$ and ground potential, to provide a signal inversion between the voltage on input node 3 and the voltage on pad output node 4. Pad 4 is illustrated in FIG. 1 to be connected to a generic capacitor $C_L$ and resistor load $R_L$ load, so as to conduct a combined load current $I_{L1}$. A time plot of a representative load current for the configuration in FIG. 1 is shown in FIG. 2 as $I_{L1}$. In particular, note the large current peak attributable to the capacitive load. If the current conduction capabilities of either inverter driver transistors 1 or 2 are reduced to lower the current peak, with the intent of avoiding power supply path or ground line spikes on the chip, the pad output impedance is increased and the drive capability is decreased. Therefore, what is desired is an output pad driver circuit which controls the transient current waveform to limit current spikes while providing an effective low output impedance.

Figure 3:
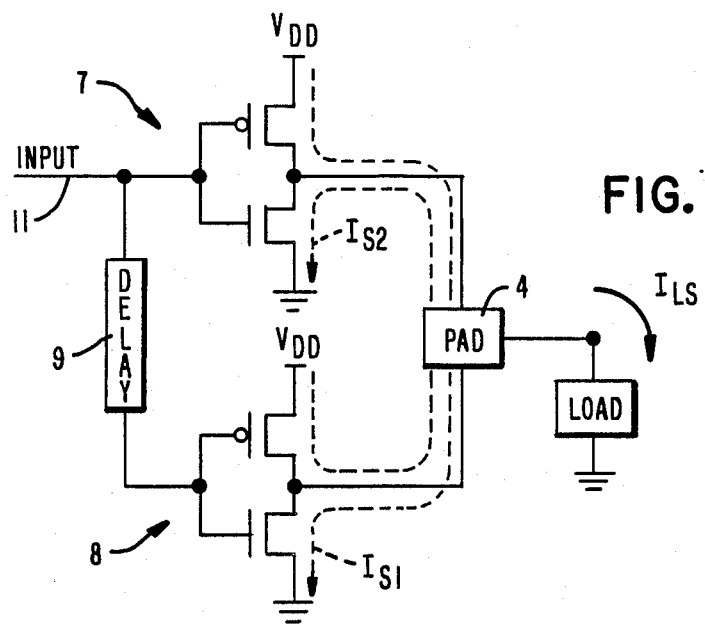
FIG. 3 illustrates a variation on the schematic of FIG. 1, wherein a second CMOS inverter is connected in parallel and enabled by delay.

A first perceived solution might involve the addition of another inverter driver stage in electrical parallel with the primary inverter driver, but enabled at an incrementally delayed time interval. Unfortunately, this seemingly simple solution is not viable. The problem is described with reference to the illustration in FIG. 3, where a CMOS inverter driver circuit 7 is configured in parallel with a supplemental driver stage 8. The second stage 8 is enabled using an input signal time shifted by delay 9. Inverter drivers 7 and 8 in FIG. 3 are individually smaller than single inverter driver 5 in FIG. 1. The output load current $I_{LS}$, as depicted in FIG. 2, exhibits individually lower peak values and a time delay between respective peak occurrences, the latter attributable to the delayed enablement of inverter driver 8 with relation to that of inverter driver 7. Thereby, the parallel inverter driver pair 7 and 8 would appear to adequately drive pad 4, subject to heavy capacitive loading, while limiting the instantaneous peak current.

Unfortunately, the circuit in FIG. 3 exhibits a fundamental deficiency, commonly referred to as a sneak path. Consider, as a first instance, the situation where the voltage on input node 11 transitions from a previous high voltage state to a low voltage state. The p-channel transistor in inverter driver 7 will become enabled at a time when the n-channel transistor in inverter driver 8 is still fully conducting, given the delay of block 9 in removing the previously high voltage state. Thereby, a potentially large current path $I_{S1}$ is created between $V_{DD}$ and ground. Obviously, the sneak current reduces the output current $I_{LS}$, loads the power supply and ground paths, and if extended in time, subjects the series transistors to potential damage. In the opposite transition of voltage states, from a low input voltage state to a high input voltage state, the circuit is subject to a similar current sneak path $I_{S2}$, with similar consequences.

U.S. Pat. Nos. 4,518,873 and 4,628,218 recognize such potential sneak current problems and propose synchronization or interlock refinements. Current waveforms are not controlled in either.

A cascaded single channel type transistor circuit with time delayed current control appears in U.S. Pat. No. 4,129,792. However, among other differences, it is neither CMOS nor responsive, in a feedback and adaptive sense, to different capacitive loads.

Figure 4:
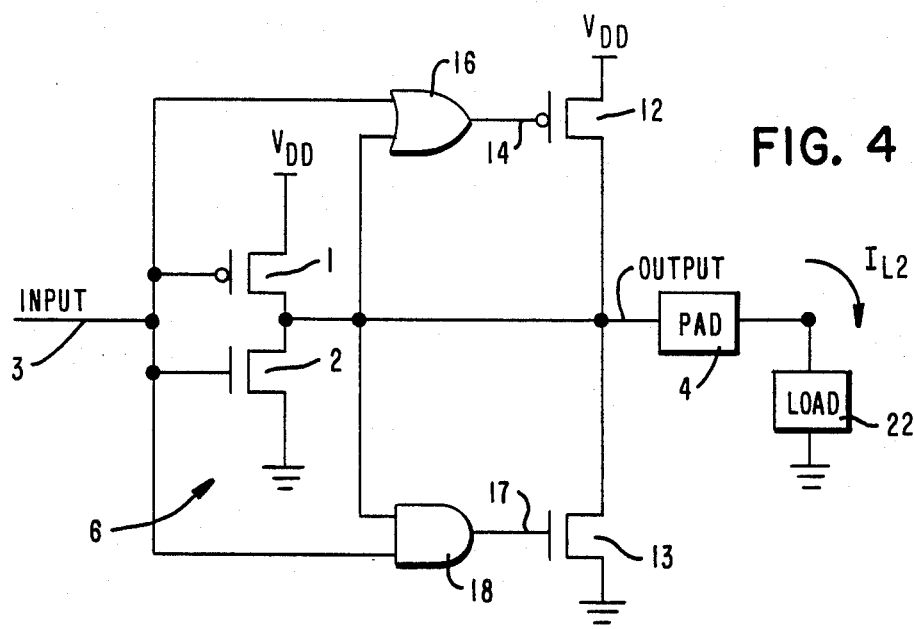
FIG. 4 is a schematic illustrating a fundamental embodiment of the present invention.

The present invention overcomes the various deficiencies of the prior art by providing an output driver circuit with both time distributed and load adaptive current control. A fundamental embodiment of the invention is depicted in FIG. 4. Conventional CMOS inverter driver 6, comprised of p-channel field effect transistor 1 and n-channel field effect transistor 2, connected in push-pull arrangement with both gate electrodes common to node 3, is supplemented by a functionally parallel set of field effect driver transistors 12 and 13. P-channel field effect transistor 12 is connected at its source electrode to $V_{DD}$ and its drain electrode to output pad node 4, while the complementary n-channel field effect transistor 13 has its drain electrode connected to output pad node 4 and its source electrode connected to ground. Gate electrode 14 of p-channel transistor 12 is driven by the output of two input OR logic gate 16, while gate electrode 17 of n-channel transistor 13 is driven by the output of two input AND logic gate 18. One input to each of logic gates 16 and 18 is connected to common input node 3, while the other input lines to the pair of logic gates are connected in common to output pad node 4. As so configured, supplemental driver transistor 12 selectively augments primary inverter driver transistor 1 while supplemental driver transistor 13 does likewise for transistor 2, without spurious current sneak paths. Furthermore, logic gates 16 and 18 are configured to detect the voltage conditions on output pad node 4, and to inhibit the enablement of supplemental transistors 12 or 13 unless the voltage on output pad node 4 is sufficiently loaded by capacitors and resistors in load 22 to temporarily suppress the voltage of pad node 4 in relation to that defined by the signal on input node 3.

Figure 5:
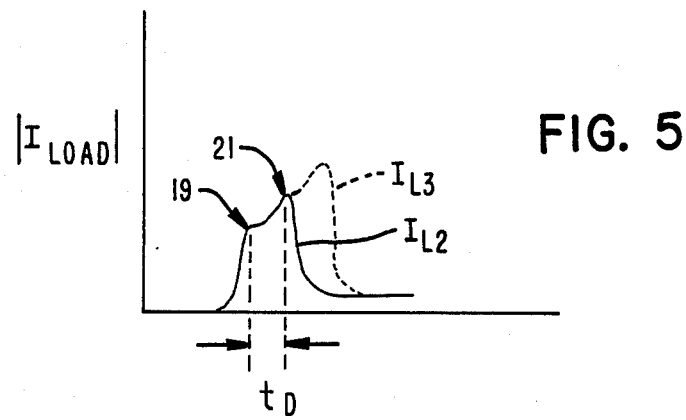
FIG. 5 illustrates the load current waveform for the embodiment in FIG. 4.

FIG. 5 illustrates the results in terms of typical load current waveforms, wherein the $I_{L2}$ is comprised of a first current peak 19 attributable to the direct action of primary driver transistor 1 (or 2) and a later timed peak 21 attributable to the additional contribution of supplemental driver transistor 12 (or 13). It will be no doubt be understood that the time interval between peaks 19 and 21, namely $t_D$, is associated with the inherent delay of OR logic gate 16 (or AND logic gate 18).

To understand the operation of the fundamental circuit embodiment depicted in FIG. 4, one must first recognize that the conductive path through a field effect transistor is represented in the ideal equivalent as a switch connected in electrical series with a resistor. Likewise, the output pad load 22 may be represented in most cases by capacitive and resistive load elements, as originally depicted in FIG. 1. When the voltage on input node 3 of the inverter driver circuit has stabilized to a steady-state high voltage level of $V_{DD}$, the output voltage on pad node 4 will have stabilized to a low voltage ground level, corresponding to a conductive state in n-channel field effect transistor 2 and a non-conductive state in p-channel field effect transistor 1. Under such input and output node voltage conditions, the output of AND logic gate 18 on line 17 is likewise at ground potential, given the nonsatisfaction of the AND condition. With line 17 at ground, field effect transistor 13 is disabled. The output of OR logic gate 16 on line 14 under such steady-state conditions is at the high voltage state of $V_{DD}$. Consequently, field effect transistor 12 is also disabled.

Next, consider the steady-state condition where the voltage on input node 3 is at the low state, ground level, while the output voltage on pad node 4 is stabilized to the high voltage level of the $V_{DD}$. Under those conditions, n-channel field effect transistor 2 is disabled, while p-channel transistor 1 is enabled. Again, the AND conditions required of logic gate 18 are not satisfied, producing a low voltage output on line 17 to disable field effect transistor 13. Similarly, output of OR logic gate 16, under a steady-state high level of output node 4, again provides a high output level on line 14 to disable p-channel transistor 12. Consequently, as was the case with the high level steady-state input, pad output node 4 is driven exclusively by the transistors in CMOS inverter driver 6.

The transient operating conditions for the fundamental circuit depicted in FIG. 4 present a different situation. For example, a transition of the input voltage on node 3 from a steady-state high voltage to a low voltage immediately disables field effect transistor 2, while enabling field effect transistor 1. The capacitive aspect of load 22, however, continues to hold the output voltage on pin 4 at or near ground level by virtue of the limited current $I_{L2}$ (FIG. 5) that can be supplied through transistor 1. During such time interval the output of OR logic gate 16 on line 14 is at a low level, causing p-channel transistor 12 to be enabled and thereby provide supplemental current to pad node 4. As shown by the waveform for $I_{L2}$ in FIG. 5, the current supplied by transistor 12 at peak 21 is delayed in the progression of the signals through OR logic gate 16 and transistor 12 itself.

Furthermore, note that the output of OR logic gate 16 on line 14 remains low only until the pad node voltage rises above the threshold defined as the high logic state. In this way, the supplemental current furnished through transistor 12 is not only time shifted but is also transient and adaptive to the demands of load 22. During this same transient period, for the conditions defined, namely where input node 3 and pad output node 4 voltages are low, the output of AND logic gate 18 remains low to hold transistor 13 disabled.

Now consider the complementary operating condition, where input node 3 is at a steady-state low of ground with pad output node 4 at a steady-state high voltage level of $V_{DD}$. In that situation, the capacitance of load 22 is fully precharged to voltage $V_{DD}$ at the onset of transition. Upon the transition of the voltage on input node 3 to a high state, transistor 1 is disabled while transistor 2 is enabled. Again, in view of the intrinsic resistance of transistor 2, the output voltage on pad node 4 temporarily remains high by virtue of the charge retained by the load capacitance. With a high voltage on input node 3 and pad output node 4, the output of AND logic gate 18 on line 17 switches high and enables transistor 13. Thereafter, transistor 13 supplements transistor 2, during this transient period, in discharging the capacitive element in load 22. The output of OR logic gate 16 remains high to continue the disablement of transistor 12.

The fundamental invention depicted in FIG. 4 thereby provides supplemental current drive and discharge capability for pad output node 4 in a controlled context of transient operation, is self-adaptive as to the load demands by direct feedback, and is configured to operate in a time delayed sequence to minimize supply voltage and ground path current spikes.

Figure 6:
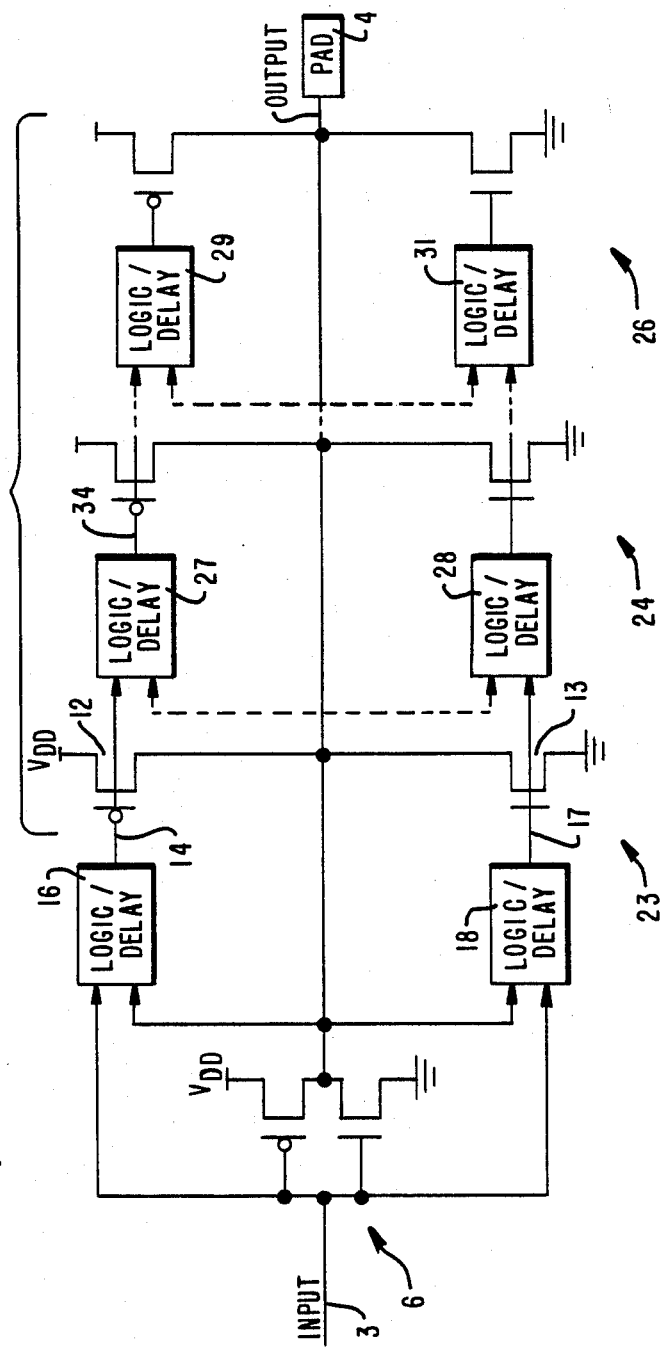
FIG. 6 schematically illustrates a cascaded embodiment of the invention, providing both delay and sensing logic in successive states.

The fundamental concepts embodied in the circuit shown in FIG. 4 may be expanded by cascading multiple supplemental driver transistor stages, such as 23, 24 and 26 in FIG. 6. The use of multiple, time delayed, load adaptive driver stages provides a somewhat increased range of capacitive load adaptation, or instance, with small capacitive loads the charging and discharging functions may be fully accomplished by the primary inverter driver 6 supplemented by stage 23 alone, while for heavy capacitive loads the primary driver 6 may be supplemented by four or more cascaded stages of delayed drivers. Clearly, the sizes of the transistors and the delay characteristics must be selected by the designer of the circuit given anticipated load conditions, as well as the power supply and ground path current conduction and noise limitations.

Figure 7:
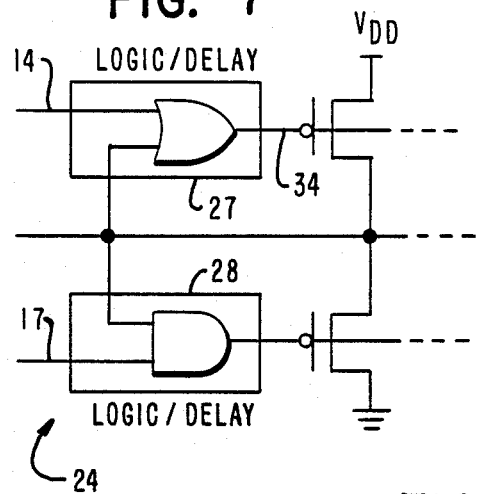
FIG. 7 schematically illustrates one logic/delay implementation of a cascaded stage.
Figure 8:
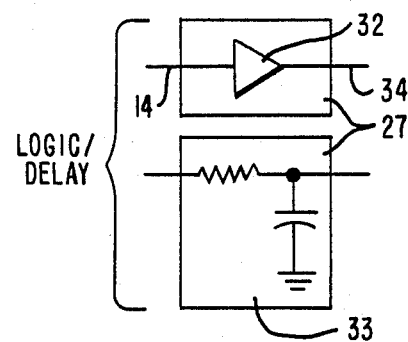
FIG. 8 illustrates representative delay elements for cascaded stages.

Representative circuits for implementing logic/delay blocks 16, 18, 27, 28, 29 and 31 for the cascaded configuration illustrated in FIG. 6 appear in FIG. 7. For example, lines 14 and 17 which drive the gate electrodes of respective transistors 12 and 13 also serve as input signals to the next successive logic/delay stage, herein 24. The signal conditioning performed by logic implementations for blocks 27, 28, 29 and 31, as depicted in FIGS. 6, could be accomplished with substantially equal effect using delay stages alone, such amplifier 32 or RC circuit 33 in FIG. 8, between e.g. lines 14 and 34. Note that the use of direct delay elements such as illustrated in FIG. 8 require that the first set of logic/delay elements 16 and 18 exist as disjunctive and conjunctive logic blocks.

The generalized cascaded stage embodiment depicted in FIG. 6 is subject to other refinement. For instance, amplifier induced delays may be added to the lines which connect pad output node 4 to the respective logic/delay blocks 16, 18, 27, 28, 29 or 31 to refine the current waveforms. The direct inclusion of such delays would serve to extend the enablement time of the supplemental driver transistors in order to shorten the rise of fall times of the pad output node voltages.

Figure 9:
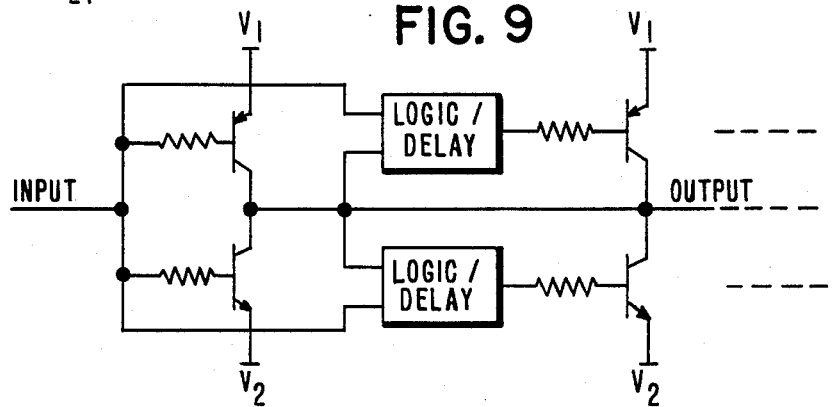
FIG. 9 schematically illustrates a bipolar transistor embodiment of the present invention FIG. 10 schematically illustrates a distributed delay embodiment in an integrated circuit layout of the supplemental driver transistors.

The fundamental concepts of this invention are not limited to operations between a power supply voltage of $V_{DD}$ and ground potential, and as such can accommodate numerous combinations of positive and negative voltages. Similarly, the underlying concepts are not limited to applications involving field effect transistors. For instance, FIG. 9 illustrates an implementation utilizing bipolar transistors arranged in generic push-pull configuration combined with disconjunctive and conjunctive logic/delay elements. The same concepts of adaptive feedback, transient enablement, and sequentially delayed current contribution apply.

Figure 10:
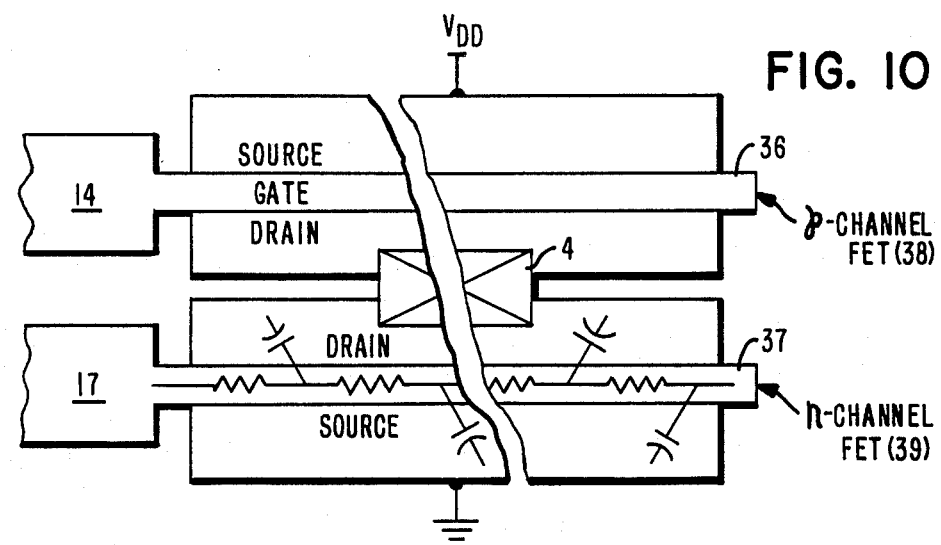

FIG. 10 schematically illustrates an integrated circuit layout for a pair of supplemental driver transistors of field effect type which structurally embody the successive delays functionally attributed to blocks 27, 28, 29 and 31 in FIG. 6. As embodied in FIG. 10, lines 14 and 17, extend from the respective OR and AND logic blocks to drive the respective high distributed resistance and high distributed capacitance gate electrodes 36 and 37 of a very wide channel p-channel and n-channel field effect transistors 38 and 39 situated between $V_{DD}$ and ground. A centrally disposed pad output node contact 4 is also depicted. The enablement delay extends across the width of the structurally singular transistors 38 and 39 by virtue of the distributed resistance and capacitance of the extended gate electrodes 36 and 37.

The invention described with reference to the fundamental embodiment depicted in FIG. 4 defines a self-adaptive source of supplemental current to an inverter driver circuit, most commonly a complementary set of field effect transistors, and provides as aspects thereof, the ability to control the incremental onset of the supplemental current. A contemporary and preferred use of the invention is for driving the output pads of integrated circuit devices, which pads may be subject to diverse capacitive loads. The supplemental current is provided in a controlled and incremental sequenced order to avoid power supply and ground path current spikes. The circuit implementation involves standard logic blocks and is ameanable to cascaded implementation. A bipolar transistor implementation is readily feasible.

I claim:

1. A composite driver circuit having load and time adaptable current output, comprising:
   a first inverter driver circuit having an input node and an output node;
   a pair, pull-up and pull-down, of complementary transistors, having respective input lines serially connected between a high voltage and a low voltage, with the common intermediate connection of the transistors connected to the output node of the first inverter;
   first OR gate connected to sense the voltages on the first inverter input and output nodes and to provide an output disabling the pull-up transistor when active; and
   first AND gate connected to sense the voltages on the first inverter input and output nodes and to provide an output enabling the pull-down transistor when active.

2. The apparatus recited in claim 1, further comprising:
   a second pair, pull-up and pull-down, of complementary transistors, serially connected between high and low supply voltage, having respective input lines and joined at a common intermediate connection in common with the output node of the first inverter circuit;
   first delay means connected between the input line of the second pull-up transistor and the output of the OR gate; and
   second delay means connected between the input line of the second pull-down transistor and the output of the AND gate.

3. The apparatus recited in claim 2 wherein the first inverter driver circuit is comprised of a pair of complementary field effect transistors connected across a voltage supply with the common connection of the gate electrodes to the input thereof node.

4. The apparatus recited in claim 2, wherein the complementary transistors include bipolar transistors conductively connected in series across a power supply and having the base electrodes connected to be responsive to the respective input signals.

5. The apparatus recited in claim 2, wherein the second pair of complementary transistors, and the first and second delay means, are replicated in like succession in multiple stages.

* * * * *